US009231176B2

(12) United States Patent
Ong et al.

(10) Patent No.: US 9,231,176 B2
(45) Date of Patent: *Jan. 5, 2016

(54) NARROW VIEWING ANGLE PLASTIC LEADED CHIP CARRIER

(71) Applicant: Intellectual Discovery Co., Ltd., Seoul (KR)

(72) Inventors: Eng Chuan Ong, Penang (MY); Meng Ee Lee, Penang (MY); Chiau Jin Lee, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/036,297

(22) Filed: Sep. 25, 2013

(65) Prior Publication Data

US 2014/0175486 A1 Jun. 26, 2014

Related U.S. Application Data

(63) Continuation of application No. 13/025,603, filed on Feb. 11, 2011, now Pat. No. 8,569,778.

(51) Int. Cl.
*H01L 33/00* (2010.01)
*H01L 33/60* (2010.01)
*H01L 33/62* (2010.01)

(52) U.S. Cl.
CPC .............. *H01L 33/60* (2013.01); *H01L 33/62* (2013.01); *H01L 2224/48091* (2013.01); *H01L 2224/48247* (2013.01)

(58) Field of Classification Search
CPC ......... H01L 33/60; H01L 33/58; H01L 33/62; H01L 33/405
USPC ........................... 257/84, 98, 99, E33.072, 58
See application file for complete search history.

(56) References Cited

U.S. PATENT DOCUMENTS 8,569,778 B2 * 10/2013 Ong et al. ...................... 257/98

* cited by examiner

*Primary Examiner* — Julia Slutsker
(74) *Attorney, Agent, or Firm* — Fox Rothschild LLP

(57) ABSTRACT

The PLCC package enables a narrow viewing angle without requiring a second lens by providing the PLCC package with a reflector cup having multiple stages where the geometry or some other characteristic of one stage is different from the geometry or some other characteristic of another stage.

6 Claims, 4 Drawing Sheets

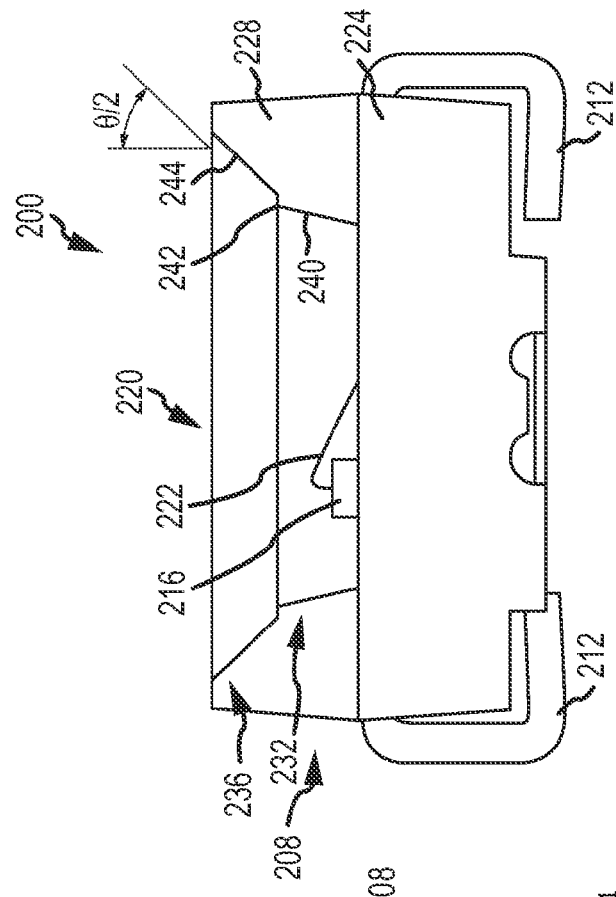
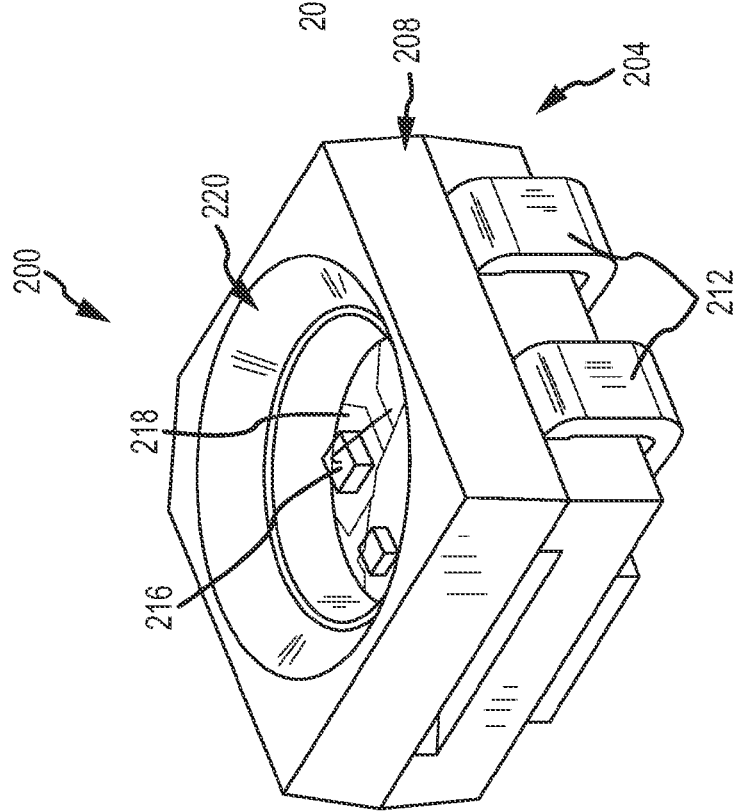

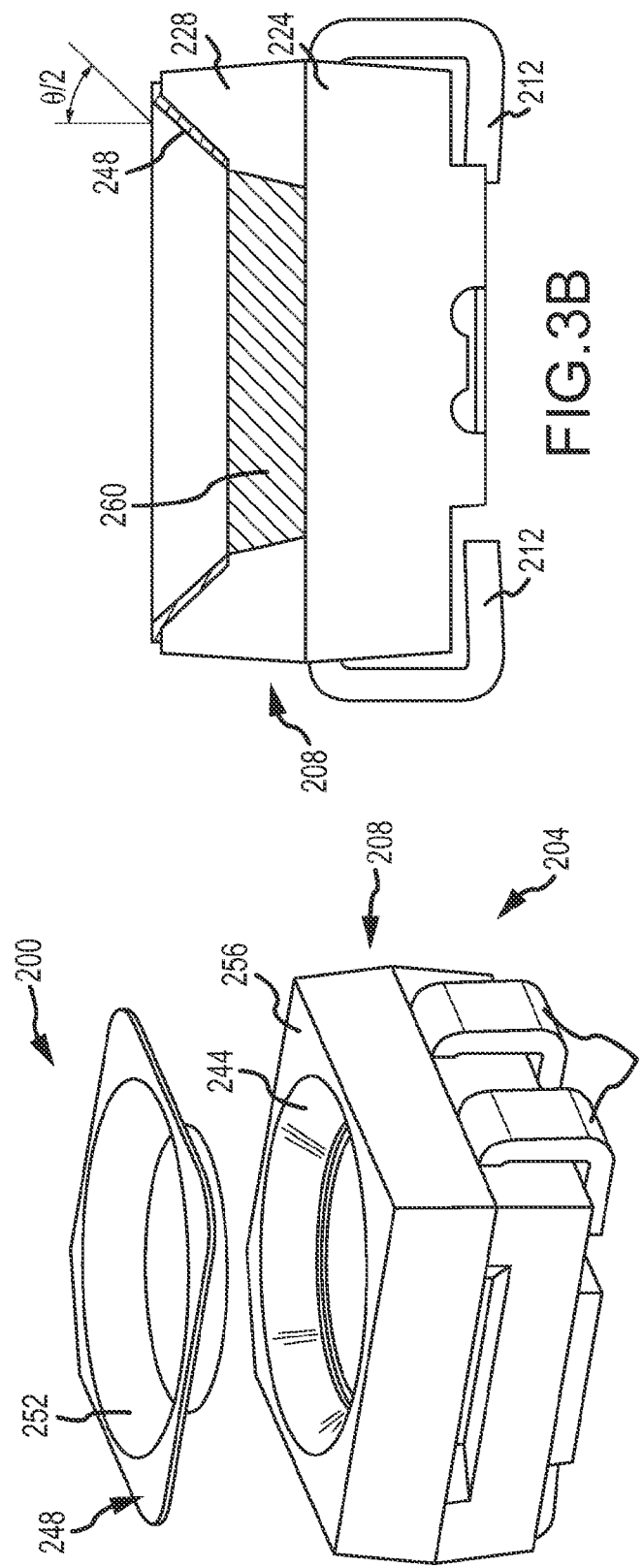

NARROW VIEWING ANGLE PLASTIC LEADED CHIP CARRIER

This application is a continuation of U.S. patent application Ser. No. 13/025,603 filed in the United States on Feb. 11, 2011, which is hereby incorporated by reference in its entirety.

FIELD OF THE DISCLOSURE

The present disclosure is generally directed toward light emitting devices and packages for the same.

BACKGROUND

Light Emitting Diodes (LEDs) have many advantages over conventional light sources, as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Among the various packages for LEDs, an LED package of interest is the Plastic Leaded Chip Carrier (PLCC) package for a surface mount LED. Surface mount LEDs in PLCC packages may be used, for example, in automotive interior display devices, electronic signs and signals, and electrical equipment.

In some LED applications, a narrow viewing angle LED is required. As used herein, a narrow viewing angle refers to limiting the viewing angle (also referred to as the spatial radiation pattern) of less than or equal to 80 degrees (i.e., less than or equal to 40 degrees off-axis). When the LED is packaged within traditional PLCC and the LED naturally emits light at a relatively wide viewing angle, the PLCC package must be modified to accommodate a narrow viewing angle.

As can be seen in FIG. 1, traditional PLCC packages 100 for LEDs include cast epoxy/silicone on a plastic molded lead frame 104 which includes a plastic molded cup 108 and one or more leads which constitute a lead frame 112. Traditional plastic molded lead frames 104 are provided with a reflector cup into which the LED is mounted. The reflector cup in traditional plastic molded lead frames 104 is generally uniform in nature in that the inner wall of the reflector cup has a single offset or tilt angle relative to the surface on which the LED is mounted. If a white LED is desired, then epoxy/silicone can be provided in the reflector cup with phosphor. In previous solutions, a narrow viewing angle was achieved for PLCC packages 100 by attaching a lens 116 to the plastic molded cup 108. The profile of the lens 116 is specifically formed to minimize the viewing angle of the LED in the PLCC package.

There are several downsides to utilizing a lens 116 to achieve a narrow viewing angle. First, the addition of more components to the PLCC package increases its cost. Second, the lens 116 is usually attached with glue, which is also a complicated process and is not necessarily that easy to control. Third, the viewing angle for the LED will not be accurate if the lens 116 is tilted in any way or offset relative to the LED during the assembly process.

BRIEF DESCRIPTION OF THE DRAWINGS

The present disclosure is described in conjunction with the appended figures:

FIG. 2A is a perspective view of a PLCC package without an encapsulant in accordance with embodiments of the present disclosure;

FIG. 2B is a cross-sectional view of a PLCC package without an encapsulant in accordance with embodiments of the present disclosure;

FIG. 3A is a perspective view of a PLCC package with an encapsulant in accordance with embodiments of the present disclosure;

FIG. 3B is a cross-sectional view of a PLCC package with an encapsulant in accordance with embodiments of the present disclosure.

DETAILED DESCRIPTION

Figure 1:
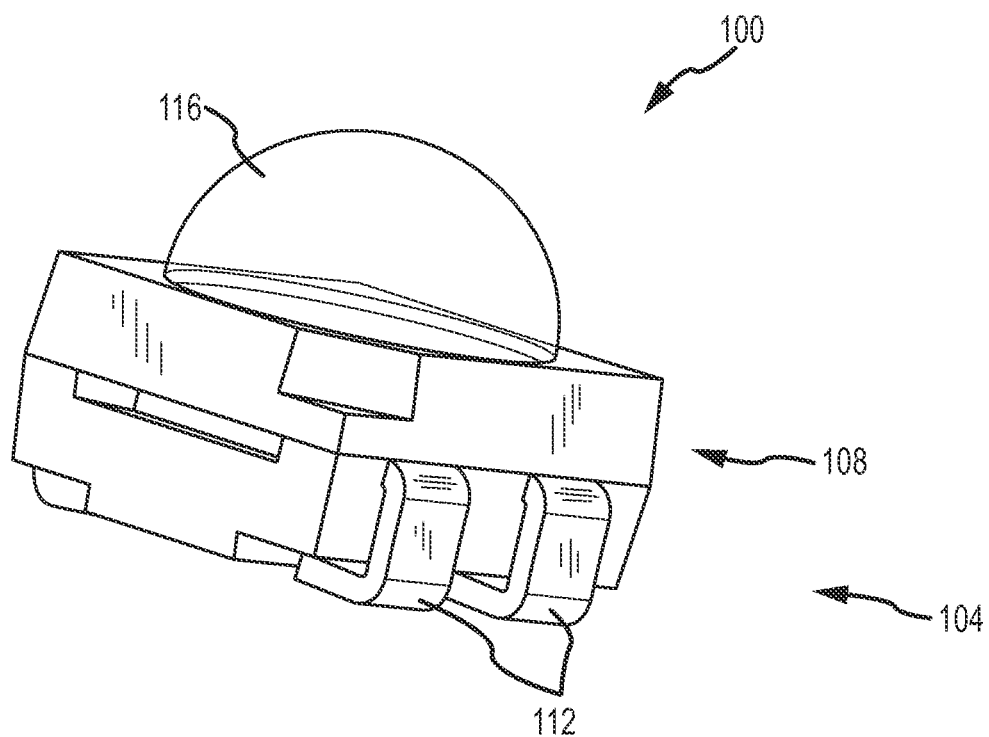
FIG. 1 is a perspective view of a PLCC package in accordance with embodiments of the prior art.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although the depicted PLCC package 200 is a conventional C-bend PLCC, embodiments of the present disclosure are not so limited. In particular, embodiments of the present disclosure can be utilized in any type of known PLCC package and/or platform. Specifically, any type of PLCC package and/or platform or similar type of package for a light emitting device that uses a plastic molded lead frame can incorporate one or more features disclosed herein. Suitable types of PLCC packages that may incorporate embodiments of the present disclosure include, without limitation, a Moonstone Package which has one or more leads protruding to its side, an L-bend PLCC, a PLCC with one or more leads protruding from its bottom, and so on. One example of a PLCC package that may incorporate embodiments of the present disclosure is described in further detail in U.S. Patent Publication No. 2010/0264436 to Chuan et al., the entire disclosure of which is hereby incorporated herein by reference.

With reference now to FIGS. 2A, 2B, 3A, and 3B, a PLCC package 200 will be described in accordance with at least some embodiments of the present disclosure. Initially referring to FIGS. 2A and 2B, a PLCC package 200 that has not yet had its reflector cup 220 filled with an encapsulant is depicted in accordance with at least some embodiments of the present disclosure.

The PLCC package 200 may comprise a plastic molded lead frame 204 which includes a lead frame 212 having one or more leads 218 and a plastic molded cup 208. In some embodiments, the plastic molded cup 208 may be constructed of any polymer or combination of polymers using extrusion, machining, micro-machining, molding, injection molding, or a combination of such manufacturing techniques.

The lead frame 212 may comprise a number of leads 218 for carrying electrical current to and from a light source 216.

The leads 218 may be exposed in the bottom of a reflector cup 220 that has been formed in the plastic molded cup 208. The leads 218 may then extend or pass through part of the plastic molded cup 208 to an outer surface of the plastic molded cup 208, thereby facilitating attachment of the PLCC package 200 to an electrical circuit. Although the leads 218 of the lead frame 204 extending to the outer surface of the plastic molded cup 208 are depicted a C-leads, embodiments of the present disclosure are not so limited. In particular, any other type or shape of leads may be utilized such as, for example, SOJ leads, gull wing leads, reverse gull wing leads, and straight cut leads.

The reflector cup 220 may be formed in a top portion 228 of the plastic molded cup 208 and the leads 218 may extend partially through a bottom portion 224 of the plastic molded cup 208. A top surface of the bottom portion 224 may interface with a bottom surface of the top portion 228 and this interface may also correspond to the bottom surface of the reflector cup 220. The top surface of the top portion 228 may correspond to the light emitting surface of the PLCC package 200 as it has the opening of the reflector cup 220. In some embodiments, the area of the reflector cup 220 is larger at the top surface of the top portion 228 as compared to the bottom surface of the top portion 228. This means that the reflector cup 220 gets larger as it extends away from the light source 216.

The light source 216, in some embodiments, comprises an LED or array of LEDs. Where an LED or similar light source is used, a bonding wire 222 may be used to connect a top surface of the light source 216 to one of the leads 218 while the bottom surface of the light source 216 is connected to a different one of the leads 218 One surface of the light source 216 may correspond to an anode of the light source 216 and another surface of the light source 216 may correspond to a cathode of the light source. By connecting the light source 216 to two different leads 218 an electrical potential can be applied to the anode and cathode of the light source 216 thereby energizing the light source 216 and causing it to emit light. In some embodiments, the light source 216 is configured to emit light from its top surface.

Although a light source 216 is depicted as having an anode and cathode on opposite major surfaces, embodiments of the present disclosure also contemplate the utilization of a light source 216 having both an anode and cathode on the same surface. Such a light source 216 may be constructed using known flip-chip manufacturing processes or any other known method for establishing both an anode and cathode on a common side of a light source 216. In such an embodiment, multiple bonding wires may be used to connect to the anode and cathode separately.

In some embodiments, the PLCC package 200 includes a reflector cup 220 to control the direction in which the light emitted by the light source 216 exits the PLCC package 200. More specifically, the light source 216 may not be configured to emit a focused beam of light from its top surface, but rather may radiate light in a spread radial pattern. The natural view angle of light emitted by the light source 216 may vary from 8 to 160 degrees (i.e., 4 to 80 degrees of off-axis view angle). In embodiments where the light source 216 naturally emits light at a viewing angle greater than a preferred viewing angle, it may be necessary to configure the PLCC package 200 to control the angle 8 of light which exits the PLCC package 200.

As will be discussed in further detail herein, the reflector cup 220 may be provided with a number of optical features which allow it to control the angle 8 at which light exits the PLCC package 200, in particular by keeping the light exiting the PLCC package 200 at a narrow viewing angle. As one example, the reflector cup 220 may be at least partially filled with an encapsulant and/or may contain one or more features which limit the angle θ of light exiting the PLCC package 200 to be less than 100 degrees. Such a view angle corresponds to an off-axis angle θ/2 of light exiting the PLCC package 200. As another example, the reflector cup 220 may be at least partially filled with an encapsulant and/or be formed to limit the angle θ of light exiting the PLCC package 200 to be less than 80 degrees. As another example, the reflector cup 220 may be at least partially filled with an encapsulant and/or be formed to limit the angle θ of light exiting the PLCC package 200 to be less than 50 degrees. More specifically, any viewing angle θ between 0 and 100 degrees can be achieved by altering the optical features of the reflector cup 220.

In some embodiments, the reflector cup 220 is configured with a plurality of stages 232, 236, where each stage comprises at least one different optical property than at least one of the other stages. Differing optical properties may be achieved, for example, by altering the geometry of one stage as compared to another. As can be seen in FIG. 2B, a first stage 232 may comprise a first reflective surface 240 and a second stage 236 may comprise a second reflective surface 244.

A transition point 242 may exist between the first and second stages 232, 236. In some embodiments, the transition point 242 may correspond to a point or area where the geometry of the reflector cup 220 changes from the geometry of the first stage 232 to the geometry of the second stage 236. In some embodiments, the transition point 242 may comprise its own reflective surface and may, therefore, also be referred to as another stage of the reflector cup 220.

Although only two stages 232, 236 are depicted and described herein, embodiments of the present disclosure contemplate configuring a reflector cup 220 with two, three, four, five, six, or more different stages where each stage comprises a different geometry from that of at least one other stage in the reflector cup 220. Specifically, the plurality of stages 232, 236 may each comprise one or more of a different off-axis tilt (i.e., angle at which the reflective surface 240, 244 is tilted relative to a line which is orthogonal to the base of the reflector cup 220), a different height, a different bottom area, a different top area, a different shape (e.g., circular, elliptical, rectangular, etc.), or combinations thereof.

Differing optical characteristics may also be achieved by altering features or characteristics of the reflective surfaces 240, 244 from one stage to the next. Altering the feature or characteristics of the reflective surfaces 240, 244 may be done as an alternative to or in addition to altering the geometry between stages. As one example, the first reflective surface 240 may be formed by or be coated with a first material that has a first reflectance whereas the second reflective surface 244 may be formed by or be coated with a second material that has a second reflectance that differs from the first reflectance. Utilizing different materials on the surfaces 240, 244 can help to achieve narrow viewing angles as well as reduce light loss. In particular, if the second reflective surface 244 has a higher reflectance than the first reflective surface 240, then I-V degradation issues may be minimized and a better performing PLCC package 200 can be achieved. As another example, the first reflective surface 240 may be smooth whereas the second reflective surface 244 may be roughened.

Yet another way to alter optical characteristics between stages 232, 236 may be to fill each stage with a different encapsulant or fill some stages with an encapsulant while not filling other stages with an encapsulant. As can be seen in FIGS. 3A and 3B, one or more of the stages may be filled with an encapsulant 260 whereas other stages may not be filled with the encapsulant or may be filled with an encapsulant of a different type. The encapsulant 260 may be provided for a number of purposes. First, the encapsulant 260 may be configured to alter the color of light emitted by the light source 216 before it is emitted by the PLCC package 200. Second, the encapsulant 260 may be provided to change the index of refraction between stages. More specifically, the encapsulant 260 may have a higher index of refraction than ambient air. If the first stage 232 is filled with the encapsulant 260 and the second stage 236 is not, light will bend at the transition point 242 between the first stage 232 and second stage 236. Likewise, if the first stage 232 is filled with a first type of encapsulant 260 and the second stage 236 is filled with a second type of encapsulant that has a different index of refraction, then light will bend at the transition point 242 between the first stage 232 and second stage 236. In some embodiments, at least the top stage may not be filled with an encapsulant.

Any number of materials may be suitable for use as the encapsulant 260. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. Furthermore, different materials or combinations of materials may be used in different stages. As one non-limiting example, if the reflector cup 220 comprises three stages, then one stage of the reflector cup may comprise one or more of epoxy, silicone, and phosphor and another stage may either have no encapsulant or may have an encapsulant of a different type.

In embodiments where the encapsulant 260 fills one stage of the reflector cup 220 but not another, the encapsulant 260 may be level (i.e., parallel to the bottom surface of the top portion 228). By utilizing an encapsulant 260 that is level rather than dome-shaped as in the prior art, embodiments of the present disclosure can maintain a low profile PLCC package 200 while still achieving a narrow viewing angle.

As discussed above, it may also be beneficial to change the reflectance of the reflective surfaces from one stage to the next. One way to achieve this feature is to utilize an insert 248 that has a reflective surface 252. The reflective surface 252 of the insert 248 may have a geometry which allows the insert 248 to be received in one or more stages of the reflector cup 220. In some embodiments, the insert 248 fits within some but not all of the stages of the reflector cup. In the depicted embodiment, the insert 248 fits within the upper-most stage (i.e., the second stage 236 of the reflector cup 220). In some embodiments, the upper-most stage comprises a higher reflectance than the lower-most stage. This reflectance difference may be achieved solely with the insert 248 or by coating the reflective surfaces with different materials. If the reflective surfaces are coated with different materials, the materials may be deposited using any number of known deposition techniques such as brushing, spraying, Atomic Layer Deposition (ALD), Chemical Vapor Deposition (CVD), or the like.

In embodiments where the insert 248 only fits into one stage of the reflector cup 220, the tilt angle of the reflective surface 252 may be similar or identical to the tilt angle of the reflective surface of the stage into which the insert 248 fits. Thus, the insert 248 may act as a lining for some or all of the reflector cup 220.

The insert 248 may comprise a different reflectance than that of the plastic molded cup 208 or any coatings that are applied to the reflective surfaces 240, 244. In some embodiments, the insert 248 may comprise a thin layer of metal or a material that has been coated or plated in a metallic or reflective substance. The reflective surface 252 of the insert 248, therefore, provides a higher reflectance than the first reflective surface 240. The difference in reflectance between the stages of the reflector cup 220 help the reflector cup 220 to decrease the viewing angle of light emitted by the light source 216 as it exits the PLCC package 200. Thus, a PLCC package 200 is provided which can achieve a narrow viewing angle without requiring a dome-shaped (i.e., convex) or external optical lens on the upper surface of the top portion 228.

Figure 4:
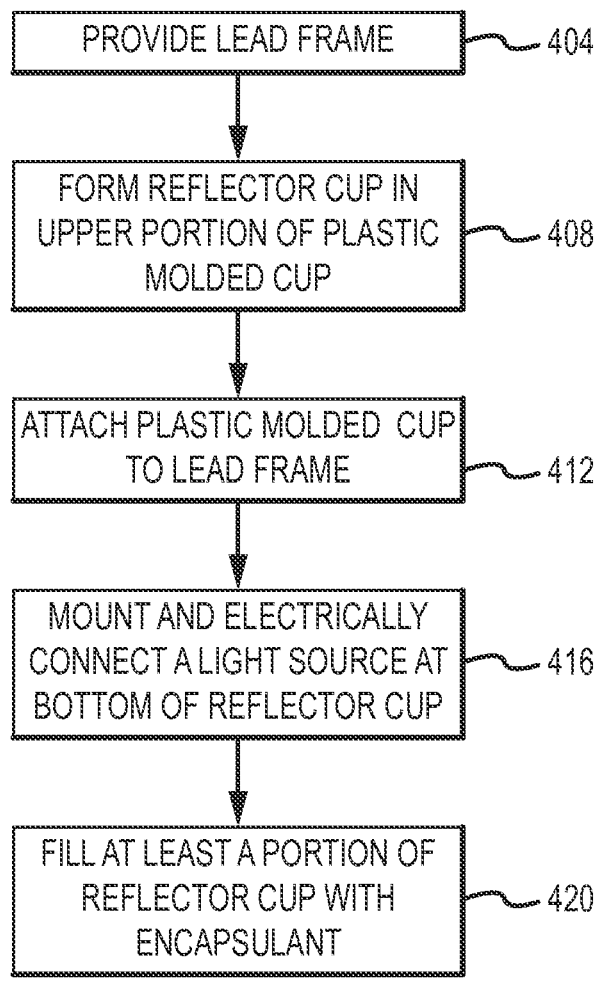
FIG. 4 is a flow diagram depicting a PLCC package manufacturing process in accordance with embodiments of the present disclosure.

With reference now to FIG. 4, a method of constructing a PLCC package 200 which is suitable for narrow viewing angle applications will be described in accordance with at least some embodiments of the present disclosure. Although the steps depicted in FIG. 4 are shown in a particular order, those of ordinary skill in the LED manufacturing arts will appreciate that certain steps may be combined and/or the order of steps may be altered without departing from the scope of the present disclosure.

Initially, a lead frame 212 having one or more leads 218 may be provided (step 404). A plastic molded cup 208 may also be provided and a reflector cup 220 may be formed in the top or upper portion 228 of the plastic molded cup 208 (step 408). In some embodiments, the plastic molded cup 208 may be formed with an injection molding process, in which case the plastic molded cup 208 may comprise a single piece of plastic. However, it may also be possible to construct the plastic molded cup 208 with one, two, three, or more separate parts that are connected to one another using a bonding or fusing process or agent. As one example, the top portion 228 may initially be a separate piece from the bottom portion 224 and the two portions may be connected to one another using glue, epoxy, a thermosetting resin, clamps, friction fittings, or the like. In some embodiments, the plastic molded cup 208 is a one-piece plastic molded compound that has been formed around the lead frame 212, which means that the various stages of the reflector cup 220 are pre-molded a priori.

In some embodiments, the plastic molded cup 208 is a single piece of plastic that has been formed by an injection molding process. The reflector cup 220 may be formed in the top portion 228 of the plastic molded cup 208 by using a machining, etching, and/or stamping process. The reflector cup 220, or portions thereof, may be formed into the top portion 228 while the plastic molded cup 208 is being formed (e.g., during the molding process). An alternative approach would be to first form the plastic molded cup 208 and then stamp or machine the top portion 228 of the plastic molded cup 208 until the reflector cup 220 has been formed. Different alternatives may be more desirable for different types of PLCC packages 200. In some embodiments, a white plastic material may be used to form some or all of the plastic molded cup 208 to improve the brightness of the PLCC package 200. In other embodiments, a black plastic material may be used to form some or all of the plastic molded cup 208 to improve the contrast of the PLCC package 200.

The plastic molded cup 208 may then be attached to the lead frame 212, thereby resulting in the plastic molded lead frame 204 (step 412). In some embodiments, it may be possible to form the plastic molded cup 208 around the lead frame 212 via a molding process rather than first forming the plastic molded cup 208 and then attaching it to the lead frame 212. Also, it may be possible to first attach the plastic molded cup 208 to the lead frame 212 and then form the reflector cup 220 in the plastic molded cup 208.

After the plastic molded cup 208 has been attached to the lead frame 212, the method continues by mounting the light source 216 into the bottom of the reflector cup 220 and electrically connecting the light source 216 to the leads 218 of the lead frame 212 (step 416). This particular step may include connecting the bonding wire 222 between the light source 216 and the lead frame 212.

After the light source 216 has been electrically connected to the leads 218 of the lead frame 212, at least a portion of the reflector cup 220 is filled with an encapsulant 260 (step 420). The encapsulant 260 may be provided into the reflector cup 220 using known injection techniques. In some embodiments, the encapsulant 260 only fills a first stage 232 of the reflector cup 220 but not a second stage 236 of the reflector cup 220. In addition to helping the PLCC package 200 achieve a narrow viewing angle, the encapsulant 260 also hermetically seals the light source 216 in the reflector cup 220 and protects the bonding wire 222 from shifting and/or breaking.

In a next optional step not shown, an insert 248 may be positioned within and secured to at least a portion of the inner surface of the reflector cup 220. In some embodiments, the insert 248 may be secured to the plastic molded cup 208 with a friction fit. In some embodiments, an adhesive may be used to secure the insert 248 to the reflector cup 220. In still other embodiments, one or more clamps, lips, or similar external connection members can be provided to secure the insert 248 to the plastic molded cup 208.

As can be appreciated, the PLCC package 200 may be manufactured individually or in a batch manufacturing process where each step described above is simultaneously performed on a plurality of PLCC packages 200.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A plastic molded lead frame comprising a reflector cup and a light source mounted in the reflector cup, wherein the reflector cup is configured to reflect light emitted by the light source and reduce a viewing angle of the light source wherein the reflector cup comprises at least a first stage with a first reflective surface having a first reflective surface tilt angle, a second stage with a second reflective surface having a second reflective surface tilt angle different than the first reflective surface tilt angle and a first encapsulant filling the first stage but not within the second stage, and wherein the plastic molded lead frame does not include a convex or external lens within the reflector cup, wherein the first reflective surface is rough and the second reflective surface is smooth.

2. The plastic molded lead frame of claim 1, wherein the reflector cup comprises a bottom area where the light source is mounted and a top area where light emitted by the light source exits the reflector cup and wherein the size of the bottom area is less than the size of the top area.

3. The plastic molded lead frame of claim 1, wherein the reflector cup is at least one of circular, elliptical, and rectangular in shape.

4. The plastic molded lead frame of claim 1, wherein the reflector cup comprises a first stage and a second stage.

5. The plastic molded lead frame of claim 4, wherein an encapsulant fills the first stage and not the second stage.

6. The plastic molded lead frame of claim 4, wherein the geometry of the first stage is different from the geometry of the second stage.

* * * * *